United States Patent
Yuri et al.

[11] Patent Number: 6,139,628
[45] Date of Patent: Oct. 31, 2000

[54] METHOD OF FORMING GALLIUM NITRIDE CRYSTAL

[75] Inventors: Masaaki Yuri, Ibaraki, Japan; Tetsuzo Ueda, Menlo Park; Takaaki Baba, Los Altos, both of Calif.

[73] Assignee: Matsushita Electronics Corporation, Osaka, Japan

[21] Appl. No.: 09/056,622

[22] Filed: Apr. 8, 1998

[30] Foreign Application Priority Data

Apr. 9, 1997 [JP] Japan ................................. 9-090673

[51] Int. Cl.⁷ ...................................... C30B 25/04
[52] U.S. Cl. ................ 117/89; 117/91; 117/99; 117/102; 117/952
[58] Field of Search ................ 117/952, 89, 91, 117/99, 102

[56] References Cited

U.S. PATENT DOCUMENTS

| | | | |
|---|---|---|---|
| 4,144,116 | 3/1979 | Jacob et al. | 117/89 |
| 4,910,436 | 3/1990 | Collins et al. | 315/111.81 |
| 5,633,192 | 5/1997 | Moustakas et al. | 117/84 |
| 5,686,738 | 11/1997 | Moustakas | 257/103 |
| 5,725,674 | 3/1998 | Moustakas et al. | 118/715 |
| 5,847,397 | 12/1998 | Moustakas | 250/370.06 |

*Primary Examiner*—Robert Kunemund
*Attorney, Agent, or Firm*—McDermott, Will & Emery

[57] ABSTRACT

The method of forming gallium nitride crystal comprises the following three steps: the first step of heating a silicon substrate 1 in gas atmosphere including gallium, the second step of forming the first gallium nitride 3 on the silicon substrate 1, the third step of forming the second gallium nitride 4 on the first gallium nitride 3 at the higher temperature than when the first gallium nitride 3 has been formed. The method including these three steps can produce a thick film crystal of gallium nitride having excellent flatness and crystallinity.

13 Claims, 10 Drawing Sheets

METHOD OF FORMING GALLIUM NITRIDE CRYSTAL

FIELD OF THE INVENTION

The present invention relates to a method of forming a gallium nitride crystal which can be used for a semiconductor LASER (Light Amplification by Stimulated Emission of Radiation) having a short wavelength, and a high power transistor operative at a high temperature.

BACKGROUND OF THE INVENTION

A semiconductor LASER is widely used for read-out and write-in from/to an optical disc. Storable amount of information per unit area of an optical disc is inversely proportional to the second power of a wavelength of the semiconductor LASER. Thus, it is effective to shorten the LASER wavelength in order to increase a storage density. Gallium nitride has a wide forbidden band gap of 3.4 eV, is a direct gap semiconductor, and can be mixed with nitride aluminum and nitride indium to produce a mixed crystal. Therefore, it is easy to produce a double-hetero structure of a semiconductor junction. Gallium nitride is thus expected as a material for a short wavelength LASER such as 400 nm or so.

Further, gallium nitride has a wide forbidden band gap and a high dielectric breakdown voltage such as 5×106V/cm, as well as a high electron saturation drift speed such as 1.5×107 cm/s, and those features encourage gallium nitride to be a material for a high-speed transistor operative at a high temperature.

In a crystal growth of gallium nitride system material, hetero-epitaxial growth using a sapphire as a substrate is employed in general, because no excellent substrate made of gallium nitride is available. In this crystal growth, a metal organic vapor phase epitaxy (MOVPE) method or a molecular beam epitaxy (MBE) method is employed in general. In addition, the halide VPE method has been introduced recently and draws attention as a tool for improving a crystallinity, where ammonia is used as a nitrogen material, and hydrogen chloride gas passed over the heated gallium surface is used as a gallium material for growing a thick film. This halide VPE method can grow a film at a growth rate of 100 micron/hour. R & D employing this method has been actively engaged on film growth technology.

In a conventional method of forming gallium nitride crystal using the halide VPE method, sapphire is used as a substrate material and a gallium nitride crystal having a film thickness of not less than 100 micron is formed. As FIGS. 10($a$) and 10($b$) depict, a sapphire substrate 5 is heated to 1000° C., and ammonia gas is reacted with gallium chloride which is produced by chloride gas passed over the surface of metal gallium (not shown) heated to 850° C., thereby forming gallium nitride 9 having over a 100 micron thickness on the sapphire substrate 5.

In this conventional method, however; the density of a growth nuclear formed on the sapphire substrate 5 is low, and the growth rate is high due to the high temperature of the substrate, as a result, three-dimensional growth becomes in majority. The surface of the gallium nitride crystal thus formed is rough, and a crystal dislocation density is high due to a large number of crystal grains, accordingly, it is difficult to obtain a gallium nitride crystal having excellent flatness as well as crystallinity through this conventional method.

SUMMARY OF THE INVENTION

The present invention aims to provide a method of forming a gallium nitride crystal having excellent flatness and crystallinity.

The present invention is completed by carrying out the knowledge which the inventors have found and experienced, i.e. in a process of hetero-epitaxial growth of gallium nitride, a product including mono-atomic metal gallium is bonded in a high density and homogeneously to a surface of a substrate, which is used as a growth nuclear for growing gallium nitride. The gallium nitride crystal of excellent flatness and crystallinity is thus produced. Further, an initial growth layer of gallium nitride is formed at a low temperature so that the growth nuclear is prevented from being re-vaporized, thus a gallium nitride crystal of excellent flatness and crystallinity is produced.

The inventors disclose one mode of the present invention hereinafter: the mode comprises the following steps:

(a) Heat the substrate in gas atmosphere including gallium.

(b) Form a first gallium nitride on the substrate.

(c) Form a second gallium nitride on the first gallium nitride at a higher temperature than the temperature when the first gallium nitride was formed.

In this mode, a product of the gas including mono-atomic metal gallium is bonded to the surface of the substrate homogeneously and in a high density by applying heat on the substrate in the gas atmosphere including gallium. The first gallium nitride is formed at the low temperature by using the product including the bonded metal gallium as a growth nuclear, thereby gallium nitride can complete its initial growth flat and homogeneously without re-vaporization. Further, after forming the first gallium nitride, the second gallium nitride is formed at the higher temperature, whereby the crystallinity of not only the first gallium nitride but also the second gallium nitride are improved through the heat treatment with the high temperature. The second gallium nitride having a flat surface and a better crystallinity is thus produced.

Another mode is disclosed as follows: After the third step of the above mode is completed, the substrate is removed. In this mode, when a pn junction such as a semiconductor LASER of gallium nitride system, or a light emitting diode is formed on the second gallium nitride, at least a part of the substrate is removed. Therefore, it is possible to form an electrode on both sides of the gallium nitride. According to this method, a manufacturing process of a device can be drastically streamlined comparing with a conventional method, which comprises the steps of (a) using sapphire having no electrical conductivity as the substrate, (b) etching a semiconductor of nitride system selectively, and (c) forming an electrode. In addition, according to this method of the present invention, since the electrodes can be firmed on both the front and rear sides, a series resistor is reduced, and thereby reducing an operation voltage of the semiconductor LASER, the light emitting diode, etc. When a transistor of gallium nitride system is formed on the second gallium nitride, heat dissipation capability can be increased from that of sapphire of which heat conductive rate is as small as 0.11 W/cm·K. This improvement can realize a higher power output than using the sapphire substrate.

It is preferable to employ the following materials as the substrate: a film made of one of sapphire, aluminum nitride, silicon carbide, zinc oxide, and silicon, and a multilayer film made of a plurality of the above materials. For instance, a substrate made of sapphire on which aluminum nitride is formed, a substrate made of silicon on which silicon carbide is formed, a substrate made of sapphire on which zinc oxide is formed, or a substrate made of silicon on which zinc oxide is formed, is used. When using a substrate made of silicon on which silicon carbide is formed, an a-axis lattice constant of silicon carbide (hexagon crystal) is 3.08 Å, and that of gallium nitride (hexagon crystal) is 3.19 Å, thus the lattice mismatching is as small as circa 3.45%. Accordingly, silicon carbide is just inserted between the silicon-made substrate and gallium nitride, and thereby reducing the crystal dislocation density on the surface of gallium nitride, comparing with the case where gallium nitride is formed directly on the silicon substrate. In another example, when the substrate made of sapphire on which zinc oxide is formed, the axis lattice constant of the zinc oxide (hexagon crystal) is 3.25 Å, and the lattice mismatching between gallium nitride and zinc oxide is as small as circa 1.91%. Therefore, zinc oxide is formed just by being inserted between the sapphire substrate and gallium nitride, and whereby the crystal dislocation density on the surface of gallium nitride can be reduced comparing with the case where gallium nitride is formed directly on the sapphire substrate.

The above gas atmosphere including gallium described in the first step is preferably a gas atmosphere passed over a heated gallium trichloride, or hydrogen chloride gas passed over heated metal gallium. In these atmosphere, mono-atomic metal gallium and a product of the gas including chlorine atom can be bonded on the substrate more densely and homogeneously. As a result, gallium nitride having a flat surface and a better crystallinity is produced.

The above gas atmosphere including gallium described in the first step is also preferably the gas passed over organo-metal including gallium. In this case, mono-atomic metal gallium and a product of the gas including organic compound such as hydrocarbon can be bonded on the substrate more densely and homogeneously. As a result, gallium nitride having a flat surface and a better crystallinity is produced.

DESCRIPTION OF THE PREFERRED EMBODIMENTS

The preferred embodiments are described by referring to the attached drawings.

Embodiment 1

Figure 1A:
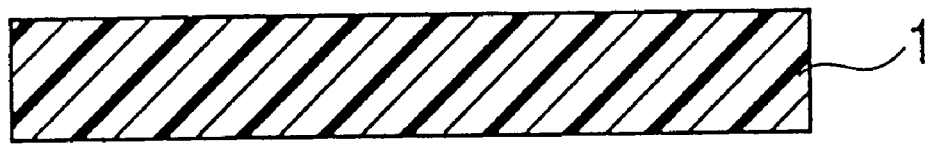
FIGS. 1(a), 1(b), 1(c), and 1(d) depict a method of forming gallium nitride of Embodiment 1 according to the present invention.
Figure 1B:
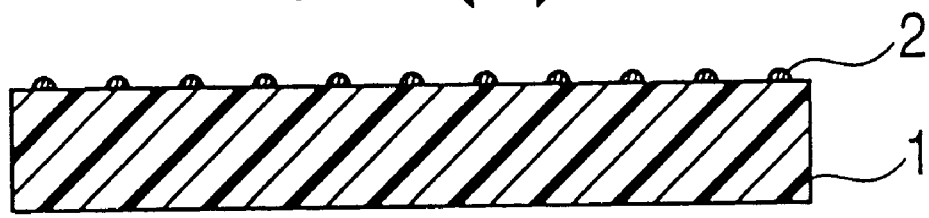

First, form a growth nuclear 2 of gallium dichloride ($GaCl_2$) on a surface of a silicon substrate 1 as shown in FIGS. 1(a) and 1(b) by reacting the silicon substrate 1 heated up to 700° C. with nitrogen gas passed over gallium trichloride ($GaCl_3$) (not shown) heated up not less than 78° C. (melting point). The growth nuclear 2 is formed on the surface of the silicon substrate 1 in the form of bonding a silicon atom to a gallium atom.

Figure 1C:
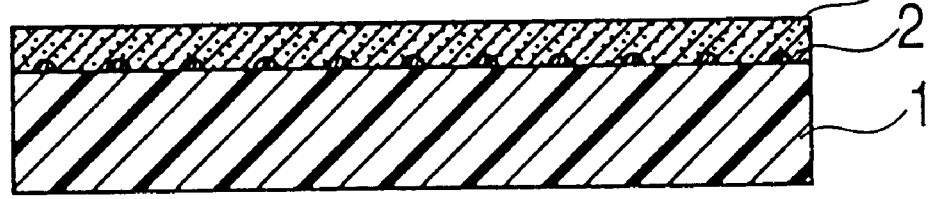

Next, as shown in FIG. 1(c), lower the temperature of the silicon substrate 1 down to 600° C., and form the first gallium nitride amorphous film layer 3 having a 500 Å film thickness on the silicon substrate 1 including the growth nuclear 2 by the halide VPE method which reacts gallium trichloride with ammonia. Further as shown in FIG. 1(d), raise the temperature of the silicon substrate 1 up to 1000° C., and form the second gallium nitride mono-crystal layer 4 having a 100 micron film thickness on the first gallium nitride layer 3 by using also the halide VPE method.

Through this method, the growth nuclear 2 can be formed homogeneously and in a high density on the silicon substrate 1. When the first gallium nitride is formed at a low temperature, gallium nitride can complete its initial growth flat and homogeneously by preventing the growth nuclear from being re-vaporized. Further, after the first gallium nitride 3 is formed, the second gallium nitride 4 is formed at the higher temperature, whereby the crystallinity of not only the first gallium nitride but also the second gallium nitride are improved through the heat treatment at the high temperature. The second gallium nitride 4 comprising a mono-crystal, and having a flat surface as well as a better crystallinity is thus produced.

Embodiment 2

Figure 1D:
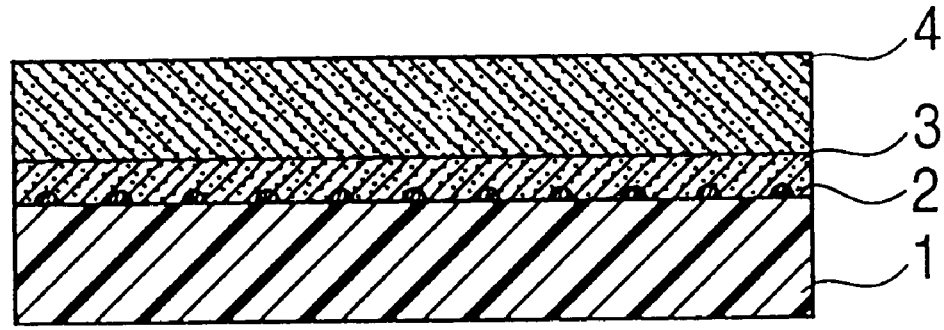
Figure 2A:
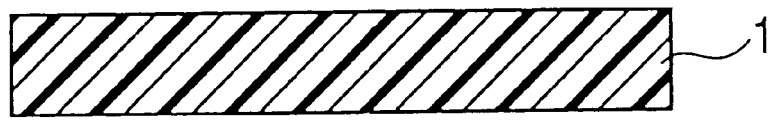
FIGS. 2(a), 2(b), 2(c), 2(d) and 2(e) depict a method of forming gallium nitride of Embodiment 2 according to the present invention.
Figure 2B:
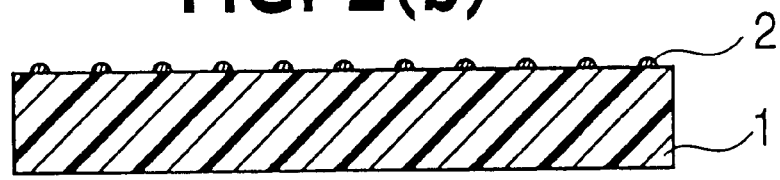
Figure 2C:
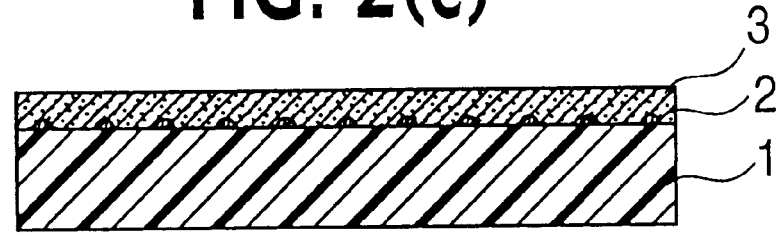
Figure 2D:
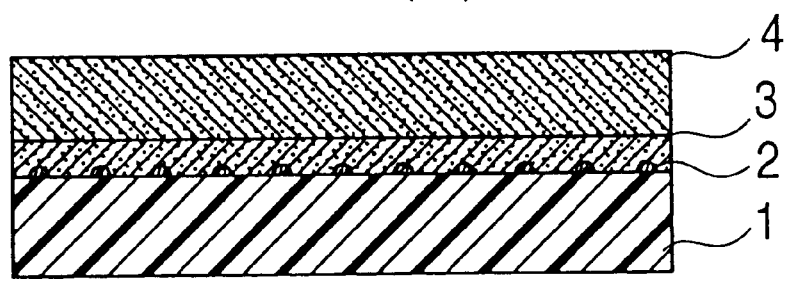
Figure 2E:
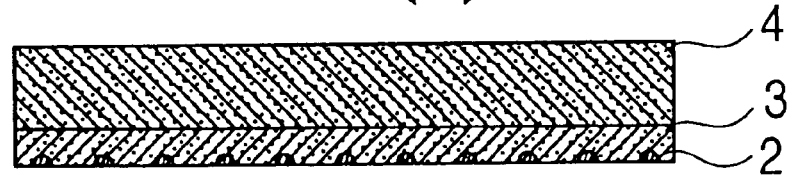

FIGS. 2(a)–2(d) depict the same process as FIGS. 1(a)–1(d) described in Embodiment 1. The details thereof are thus omitted here. Embodiment 2 differs from Embodiment 1 in the following point: After the second gallium nitride 4 is formed as shown in FIG. 1(d), another step is added, i.e. removing the silicon substrate 1 as shown in FIG. 2(e). When the silicon substrate 1 is dipped into acid solution such as mixed solution of hydrofluoric acid and nitric acid ($HF:HNO_3=1:5$), the silicon substrate 1 is removed, and a crystal comprising the growth nuclear 2, the first gallium nitride 3 and the second gallium nitride 4 are left. As a result, gallium nitride crystal without the silicon substrate 1, and yet having a flat surface and a better crystallinity is produced.

When forming a pn junction comprising a semiconductor of gallium nitride system on the second gallium nitride 4, it is possible to form an electrode on both sides of the gallium nitride. A manufacturing process of a device can be, therefore, drastically streamlined. A series resistor can be also reduced, and thus an operation voltage of the semiconductor LASER is lowered. When a transistor of gallium nitride system is formed on the second gallium nitride 4, a heat conductive rate can be increased to 1.3 W/cm·K from that of sapphire (0.11 W/cm·K). The heat dissipation capability is thus remarkably improved comparing with that of the substrate made of a small sapphire, whereby a higher power transistor can be operated.

Embodiment 3

Figure 3A:
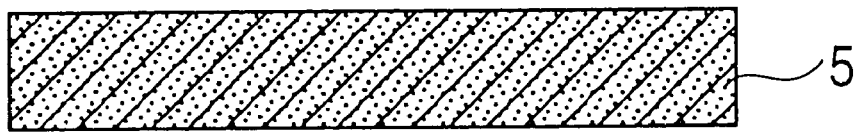
FIGS. 3(a), 3(b), 3(c), 3(d) and 3(e) depict a method of forming gallium nitride of Embodiment 3 according to the present invention.
Figure 3B:
Figure 3C:
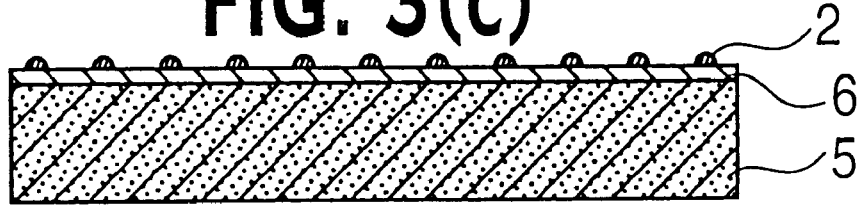
Figure 3D:
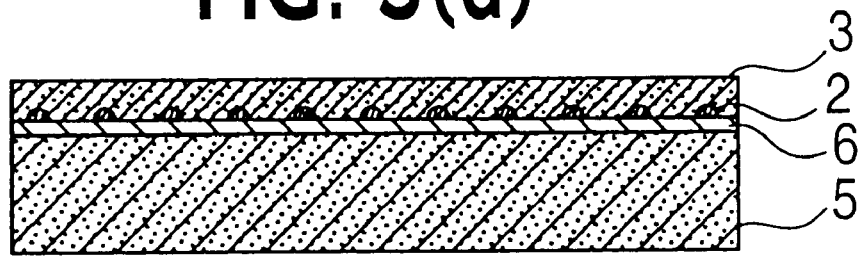
Figure 3E:
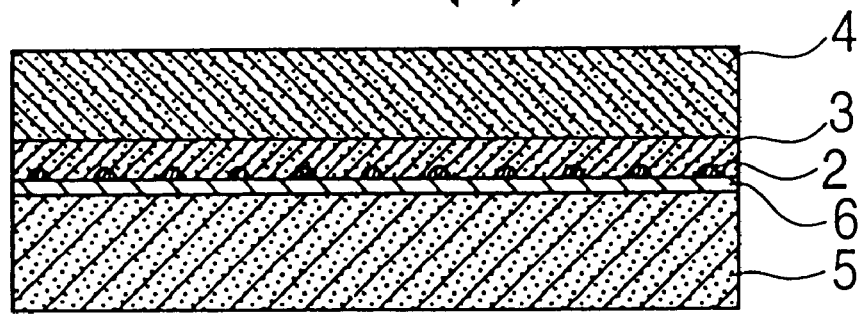
Figure 4A:
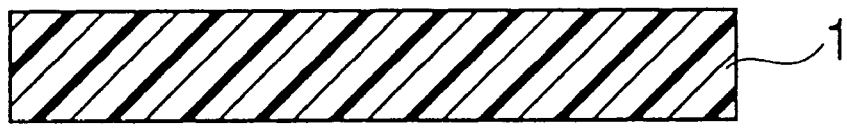
FIGS. 4(a), 4(b), 4(c), 4(d) and 4(e) depict a method of forming gallium nitride of Embodiment 4 according to the present invention.
Figure 4B:
Figure 4C:
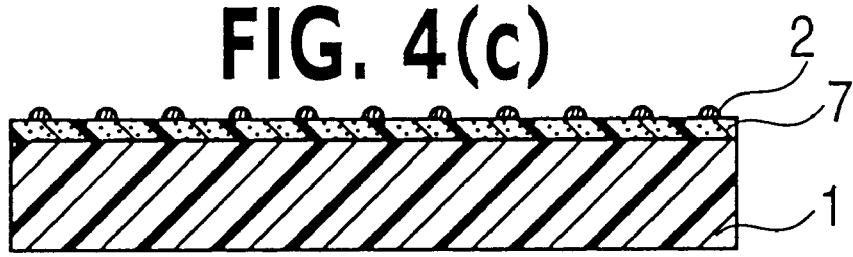
Figure 4D:
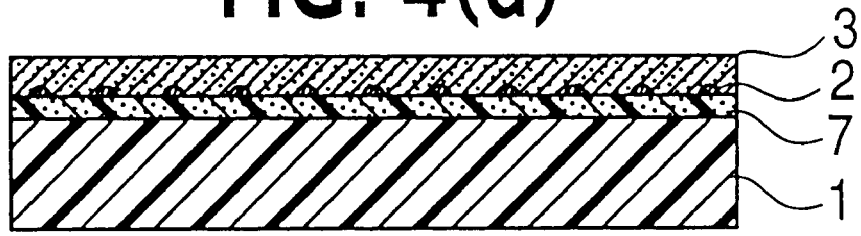
Figure 4E:
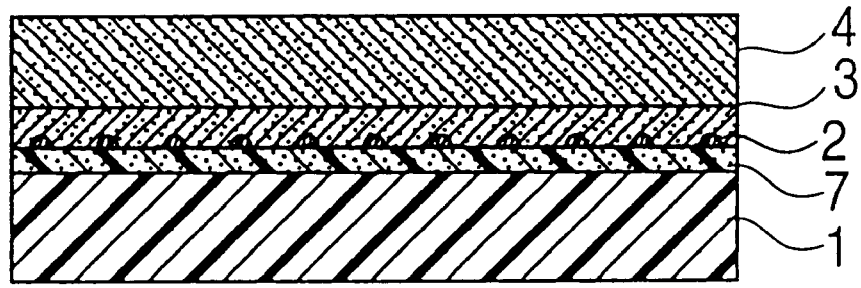
Figure 5A:
FIGS. 5(a), 5(b), 5(c), 5(d), 5(e) and 5(f) depict a method of forming gallium nitride of Embodiment 5 according to the present invention.
Figure 5B:
Figure 5C:
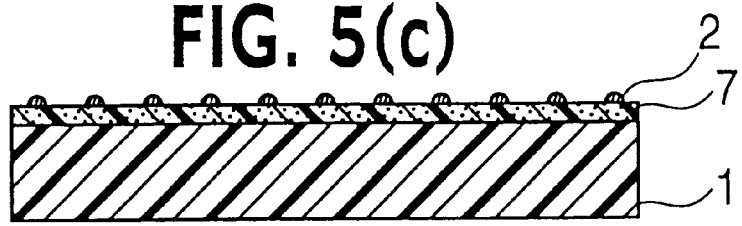
Figure 5D:
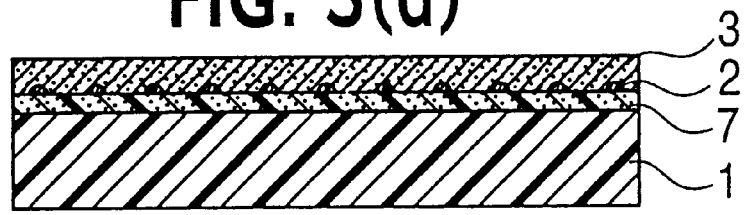
Figure 5E:
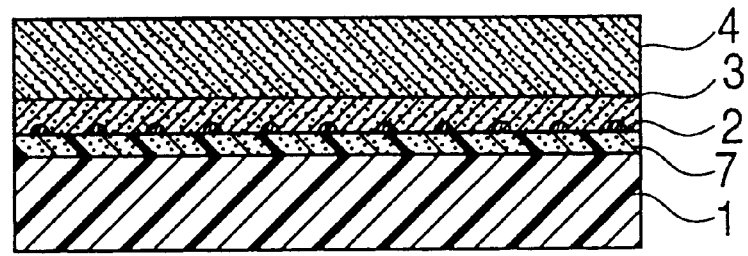
Figure 5F:
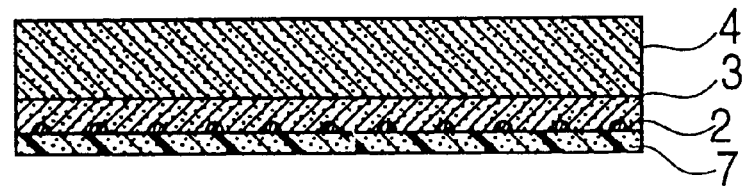
Figure 6A:
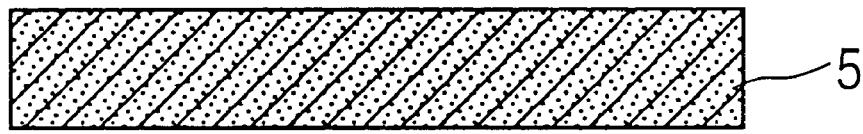
FIGS. 6(a), 6(b), 6(c), 6(d) and 6(e) depict a method of forming gallium nitride of Embodiment 6 according to the present invention.
Figure 6B:
Figure 6C:
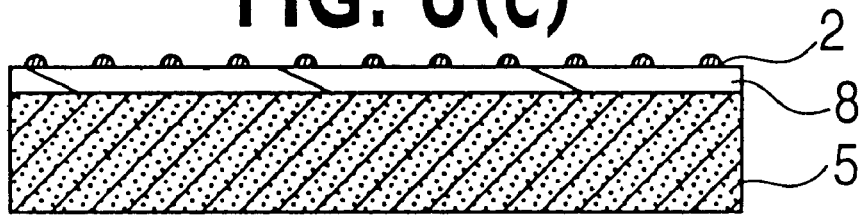
Figure 6D:
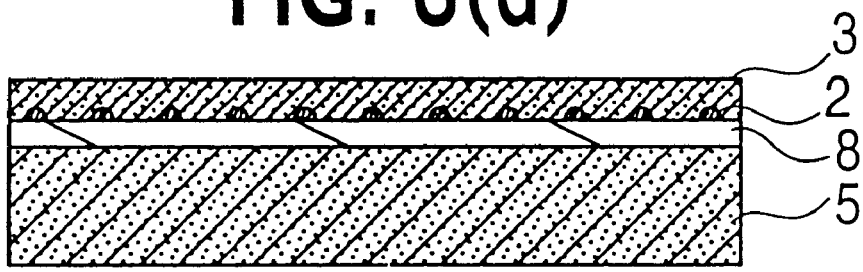
Figure 6E:
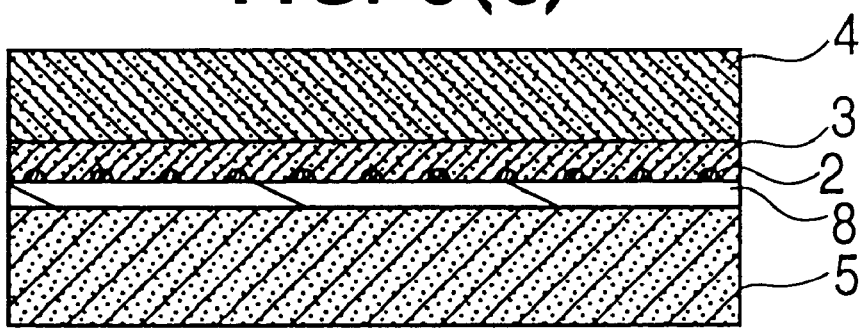
Figure 7A:
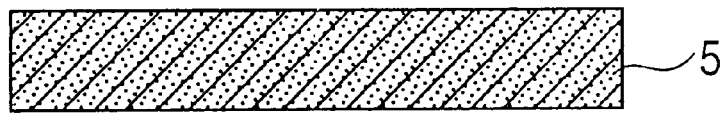
FIGS. 7(a), 7(b), 7(c), 7(d), 7(e) and 7(f) depict a method of forming gallium nitride of Embodiment 7 according to the present invention.
Figure 7B:
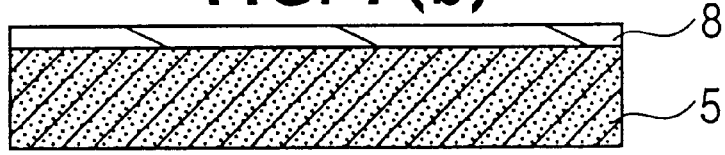
Figure 7C:
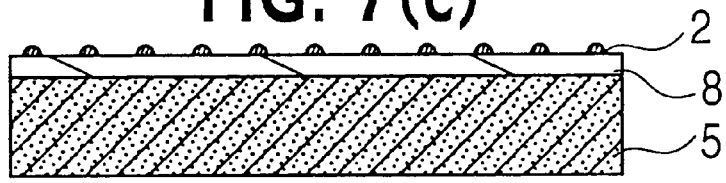
Figure 7D:
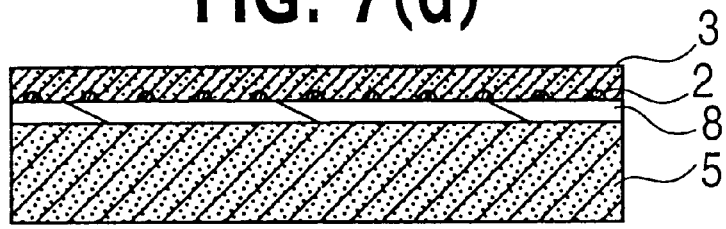
Figure 7E:
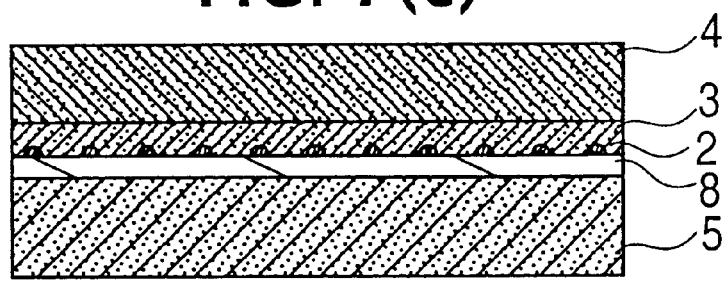
Figure 7F:
Figure 8A:
FIGS. 8(a), 8(b), 8(c), 8(d) and 8(e) depict a method of forming gallium nitride of Embodiment 8 according to the present invention.
Figure 8B:
Figure 8C:
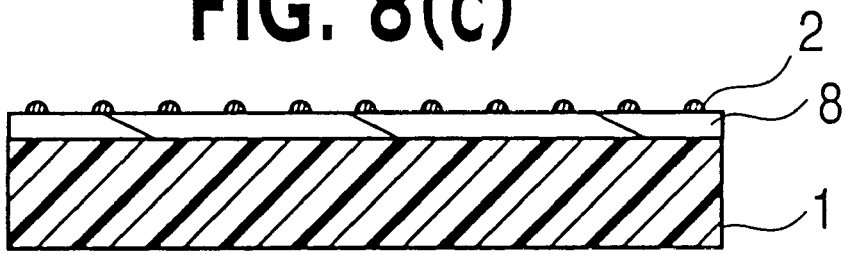
Figure 8D:
Figure 8E:
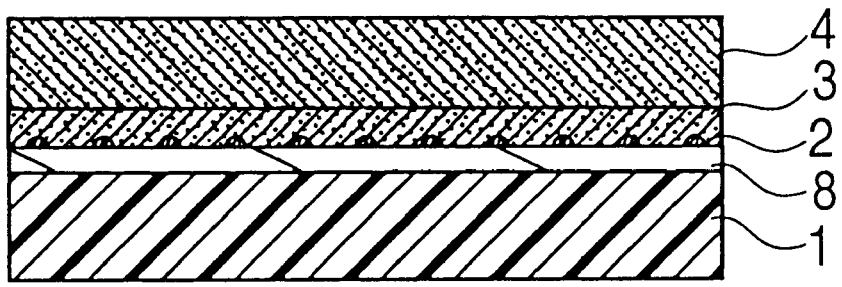
Figure 9A:
FIGS. 9(a), 9(b), 9(c), 9(d), 9(e) and 9(f) depict a method of forming gallium nitride of Embodiment 9 according to the present invention.
Figure 9B:
Figure 9C:
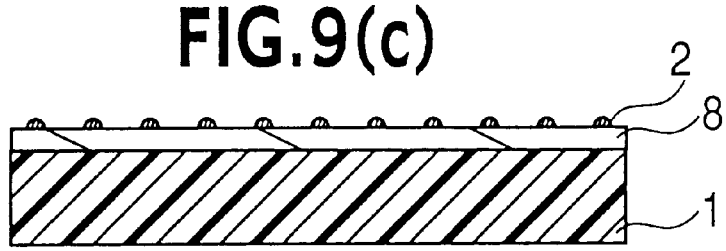
Figure 9D:
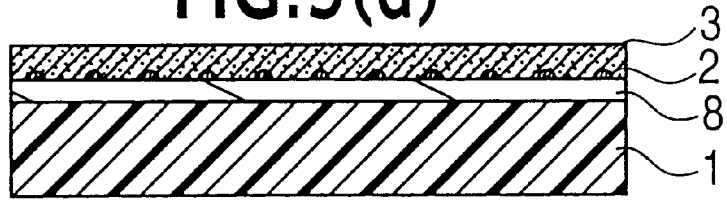
Figure 9E:
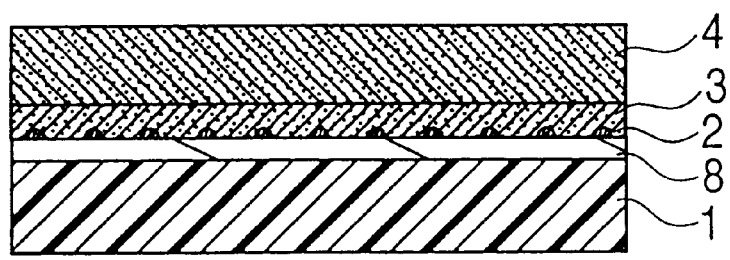
Figure 9F:
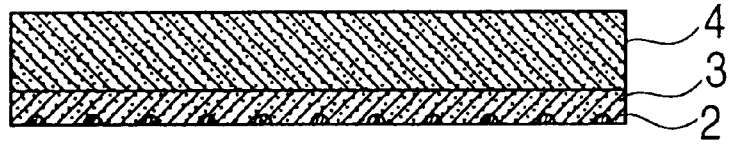
Figure 10A:
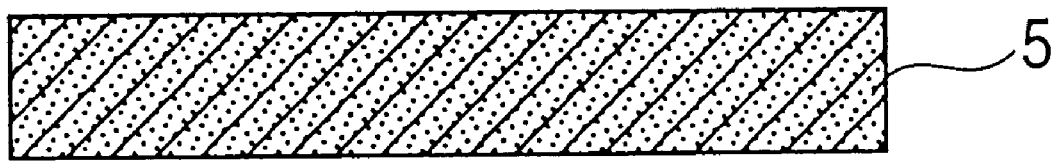
FIGS. 10(a) and 10(b) depict a conventional method of forming gallium nitride.
Figure 10B:
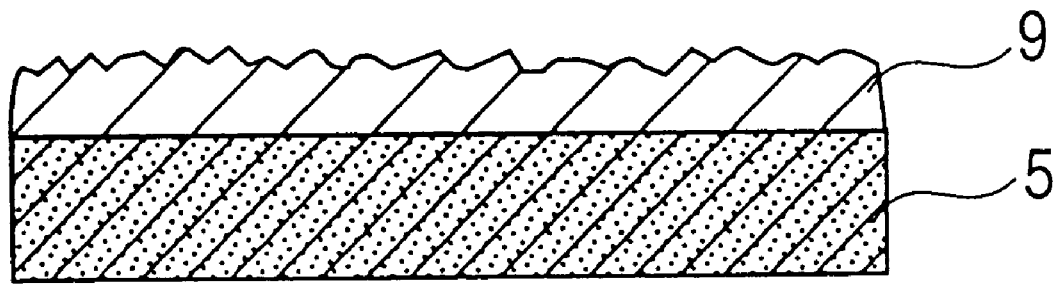

First, heat up the sapphire substrate 5 to 1000° C., and react it with ammonia, thereby forming aluminum nitride 6 on the surface of the sapphire substrate 5 as shown in FIGS. 3(a) and 3(b). Then, as shown in FIGS. 3(c)–3(e), grow the growth nuclear 2 on the aluminum nitride 6 through the same method used in Embodiment 1 [shown in FIGS.

1(*b*)–1(*d*)]. Further, form the first gallium nitride 3 and the second gallium nitride 4 sequentially.

Since aluminum nitride 6 bonds more easily to gallium dichloride than to the sapphire substrate 5, the growth nuclear 2 can be formed in the higher density than the case where the growth nuclear 2 is formed directly on the sapphire substrate 5. As a result, the first gallium nitride 3 and the second gallium nitride 4 both having the better flatness can be produced.

Embodiment 4

First, heat up the silicon substrate 1 to 1350° C., and react monosilane gas ($SiH_4$) with methane gas ($CH_4$), thereby forming a silicon carbide film 7 having a circa 1000 Å thickness as shown in FIGS. 4(*a*) and 4(*b*). Then, react nitrogen gas passed over gallium trichloride ($GaCl_3$) which has been heated at not less than 78° C. (melting point) with silicon carbide 7 which has been heated at 700° C., and thereby forming the growth nuclear 2 comprising gallium dichloride ($GaCl_2$) on the surface of the silicon carbide 7 as shown in FIG. 4(*c*). The growth nuclear 2 is formed on the silicon carbide 7 in the form of bonding a carbon atom to a gallium atom.

Next, lower the temperature of the silicon substrate 1 to 600° C., and form the first gallium nitride 3 having a 500 Å film thickness on silicon carbide 7 including the growth nuclear 2 as shown in FIG. 4(*d*) by the halide VPE method which reacts gallium trichloride with ammonia. Then, raise the temperature of the silicon substrate 1 to 1000° C., and form the second gallium nitride 4 comprising a single crystal of a circa 100 micron thickness on the first gallium nitride 3 through the halide VPE method.

In Embodiment 4, the lattice mismatching is as low as 3.45%, therefore, the crystal dislocation densities on the surfaces of the first gallium nitride 3 and the second gallium nitride 4 can be reduced comparing with the case where the first gallium nitride 3 is formed directly on the silicon substrate 1.

Embodiment 5

FIGS. 5(*a*)–5(*e*) depict the manufacturing process same as shown in FIGS. 4(*a*)–4(*e*) of Embodiment 4, the details thereof are thus omitted here. Embodiment 5 differs from Embodiment 4 in the following point: After the second gallium nitride 4 is formed as shown in FIG. 4(*e*), another step is added, i.e. removing the silicon substrate 1 as shown in FIG. 5(*f*). When the silicon substrate 1 is dipped into acid solution such as mixed solution of hydrofluoric acid and nitric acid ($HF:HNO_3=1:5$), the silicon substrate 1 is removed. When the same conductive structure is used in the first gallium nitride 3, the second gallium nitride 4 and silicon carbide thin film 7, and a pn junction comprising a semiconductor of gallium nitride system is formed on the second gallium nitride 4, an electrode can be formed both on front and rear sides of the crystal, that is same as Embodiment 2, therefore, the manufacturing process can be streamlined as well as the operation voltage of the semiconductor LASER can be lowered. When a transistor of gallium nitride system is formed on the second gallium nitride 4, heat dissipation capability is remarkably improved and thus the higher power transistor can be used, as described in Embodiment 2.

Embodiment 6

First, heat up the sapphire substrate 5 to 550° C., and form a zinc oxide thin film 8 having circa 1000 Å thickness by sputtering using a zinc oxide target in 0.01 Torr oxygen gas atmosphere, as shown in FIGS. 6(*a*) and 6(*b*). Then, react nitrogen gas passed over gallium trichloride ($GaCl_3$) being kept not less than 78° C. (melting point) with e.g. zinc oxide thin film 8 heated up to 700° C., thereby forming the growth nuclear 2 comprising gallium dichloride ($GaCl_2$) as shown in FIG. 6(*c*). The growth nuclear 2 is formed on the zinc oxide thin film 8 in the form of reacting an oxygen atom with a gallium atom.

Next, raise the temperature of the sapphire substrate 5 to 600° C., and as shown in FIG. 6(*d*), form the first gallium nitride amorphous having a circa 500 Å film thickness on the zinc oxide thin film 8 which includes the growth nuclear 2 through the halide VPE method which reacts gallium trichloride ($GaCl_3$) with ammonia. Further, heat up the sapphire substrate 5 to 1000° C. and as shown in FIG. 6(*e*), form the second gallium nitride 4, comprising a mono-crystal, having a circa 100 micron thickness through the halide VPE method on the first gallium nitride 3.

In Embodiment 6, because the lattice mismatching between zinc oxide and gallium nitride is as low as 1.91%, the crystal dislocation density on the surface of gallium nitride can be substantially reduced comparing with the case where gallium nitride is formed directly on the sapphire substrate 5.

Embodiment 7

FIGS. 7(*a*)–7(*e*) depict the manufacturing process same as shown in FIGS. 6(*a*)–6(*e*) of Embodiment 6, the details thereof are thus omitted here. Embodiment 7 differs from Embodiment 6 in the following point: After the second gallium nitride 4 is formed as shown in FIG. 6(*e*), another step is added, i.e. as shown in FIG. 7(*f*), removing the sapphire substrate 6 and zinc oxide thin film 8. Those two elements can be removed by dipping themselves into acid solvent such as aqua regia ($HCl:HNO_3=3:1$).

When a pn junction comprising a semiconductor of gallium nitride system is formed on the second gallium nitride 4, an electrode can be formed on both rear and front sides of the crystal as same as Embodiment 2. Accordingly, the manufacturing process can be streamlined as well as the operation voltage of the semiconductor LASER can be lowered. When a transistor of gallium nitride system is formed on the second gallium nitride 4, heat dissipation capability is remarkably improved and thus the higher power transistor can be used, as described in Embodiment 2.

Embodiment 8

First, heat up the silicon substrate 1 to 550° C., and form a zinc oxide thin film having circa 1000 Å thickness by sputtering using a zinc oxide target in 0.01 Torr oxygen gas atmosphere, as shown in FIGS. 8(*a*) and 8(*b*). Then, react nitrogen gas passed over gallium trichloride ($GaCl_3$) being kept not less than 78° C. (melting point) with e.g. zinc oxide thin film 8 heated up to 700° C., thereby forming the growth nuclear 2 comprising gallium dichloride ($GaCl_2$) as shown in FIG. 8(*c*). The growth nuclear 2 is formed on the zinc oxide thin film 8 in the form of bonding an oxygen atom to a gallium atom.

Next, raise the temperature of the silicon substrate 1 to 600° C. and as shown in FIG. 8(*d*), form the first gallium nitride amorphous having a circa 500 Å film thickness on the zinc oxide thin film 8 which includes the growth nuclear 2 through the halide VPE method which reacts gallium trichloride ($GaCl_3$) with ammonia. Further, heat up the silicon substrate 1 to 1000°C., and as shown in FIG. 8(*e*), form the second gallium nitride 4, comprising a single crystal, having a circa 100 micron thickness through the halide VPE method on the first gallium nitride 3.

In Embodiment 8, because the lattice mismatching between zinc oxide and gallium nitride is as low as 1.91%, the crystal dislocation density on the surface of gallium nitride can be substantially reduced comparing with the case where the first gallium nitride 3 is formed directly on the silicon substrate 1. Further, since the silicon substrate costs less than the sapphire substrate, a manufacturing cost is less expensive by Embodiment 8 than by Embodiment 6.

Embodiment 9

FIGS. 9(*a*)–9(*e*) depict the manufacturing process same as shown in FIGS. 8(*a*)–8(*e*) of Embodiment 8, the details thereof are thus omitted here. Embodiment 9 differs from Embodiment 8 in the following point: After the second gallium nitride 4 is formed as shown in FIG. 8(*e*), another step is added, i.e. as shown in FIG. 9(*f*), removing the silicon substrate 1 and zinc oxide thin film 8. In this additional step, the silicon substrate 1 can be removed by dipping itself into acid solution such as such as mixed solution of hydrofluoric acid and nitric acid (HF:HNO3=1:5), and then the zinc oxide thin film can be removed by dipping itself into acid solvent such as aqua regia (HCl:HNO3=3:1).

When a pn junction comprising a semiconductor of gallium nitride system is formed on the second gallium nitride 4, an electrode can be formed on both rear and front sides of the crystal as depicted in Embodiment 2. Accordingly, the manufacturing process can be streamlined as well as the operation voltage of the semiconductor LASER can be lowered. When a transistor of gallium nitride system is formed on the second gallium nitride 4, heat dissipation capability is remarkably improved and thus the higher power transistor can be used, as described in Embodiment 2.

Although illustrated and described herein with reference to certain specific embodiments, the present invention is nevertheless not intended to be limited to the details shown. For instance, in the above embodiments, mixed solution of hydrofluoric acid and nitric acid is used for removing the silicon substrate, and aqua regia is used for removing the sapphire substrate, however; other acid solutions can be used for that purpose. Therefore, various modifications may be made in the details within the scope and range of equivalents of the claims and without departing from the sprit of the invention.

What is claimed is:

1. A method of forming gallium nitride crystal comprising:

forming a growth nuclear including a compound comprising gallium on a substrate by heating said substrate in gas atmosphere including a compound comprising gallium, forming first gallium nitride on said substrate, and forming second gallium nitride on said first gallium nitride at a higher temperature than when the first gallium nitride has been formed.

2. The method of forming gallium nitride crystal as defined in claim 1, further comprising removing said substrate after forming the second gallium nitride.

3. The method of forming gallium nitride crystal as defined in claim 1, wherein said substrate comprises at least one of sapphire, aluminum nitride, silicon carbide, zinc oxide, and silicon.

4. The method for forming gallium nitride crystal as defined in claim 1, wherein the gas atmosphere used in forming the growth nuclear comprises gas passed over a surface of heated gallium trichloride.

5. The method for forming gallium nitride crystal as defined in claim 1, wherein the gas atmosphere used in forming the growth nuclear comprises hydrogen chloride gas passed over a surface of heated metal gallium.

6. The method for forming gallium nitride crystal as defined in claim 1, wherein the gas atmosphere used in forming the growth nuclear comprises gas passed over a surface of an organic metal including gallium.

7. A method of forming a growth nuclear including a compound comprising gallium on a substrate, said method including the step of heating said substrate in a gas atmosphere including a compound comprising gallium.

8. The method of forming a growth nuclear including a compound comprising gallium on a substrate as defined in claim 7, wherein said gas atmosphere further includes a compound comprising nitrogen.

9. The method of forming a growth nuclear including a compound comprising gallium on a substrate as defined in claim 7, wherein said gas atmosphere further includes ammonia.

10. The method of forming a growth nuclear including a compound comprising gallium on a substrate as defined in claim 7, wherein said growth nuclear comprises gallium dichloride.

11. The method of forming a growth nuclear including a compound comprising gallium on a substrate as defined in claim 7, further comprising forming an aluminum nitride layer on said substrate before forming the growth nuclear.

12. The method of forming a growth nuclear including a compound comprising gallium on a substrate as defined in claim 7, further comprising forming a silicon carbide layer on said substrate before forming the growth nuclear.

13. The method of forming a growth nuclear including a compound comprising gallium on a substrate as defined in claim 7, further comprising forming a zinc oxide layer on said substrate before forming the growth nuclear.

* * * * *